United States Patent [19]
Guo

[11] Patent Number: 4,769,785
[45] Date of Patent: Sep. 6, 1988

[54] WRITING SPEED OF SCR-BASED MEMORY CELLS

[75] Inventor: Tzen-wen Guo, Milpitas, Calif.

[73] Assignee: Advanced Micro Devices, Inc., Sunnyvale, Calif.

[21] Appl. No.: 869,757

[22] Filed: Jun. 2, 1986

[51] Int. Cl.[4] ............... G11C 11/00; G11C 11/34; G11C 7/00

[52] U.S. Cl. .................. 365/155; 365/179; 365/190; 365/204

[58] Field of Search .............. 365/155, 179, 204, 190, 365/189

[56] References Cited

U.S. PATENT DOCUMENTS

| 4,570,240 | 2/1986 | Seelbach et al. | 365/155 |
| 4,580,244 | 4/1986 | Birrittella | 365/179 |
| 4,601,014 | 7/1986 | Kitano et al. | 365/155 |
| 4,618,944 | 10/1986 | Okajima | 365/155 |
| 4,625,299 | 11/1986 | Isogai et al. | 365/155 |
| 4,646,268 | 2/1987 | Kuno | 365/179 |
| 4,692,900 | 9/1987 | Oami et al. | 365/179 |

Primary Examiner—Terrell W. Fears
Assistant Examiner—Melissa J. Koval
Attorney, Agent, or Firm—Davis Chin

[57] ABSTRACT

Load resistors are connected in series between the PNP portions of the SCRs and the upper word-line. The load presented to the NPN portions of the SCRs is thus a composite formed of a PNP transistor in series with a resistor. The resistor causes a downward shift of voltage due to IR drop on the ON side of the cell and provides a dramatic improvement in writing speed. During a write operation, the IR drop across the resistor on the ON side of the cell collapses as current declines, and the consequent rise in voltage is coupled to the low base line, significantly shortening the time required to raise its voltage sufficiently to securely write the cell.

1 Claim, 3 Drawing Sheets

WRITING SPEED OF SCR-BASED MEMORY CELLS

BACKGROUND OF THE INVENTION

The present invention relates generally to static read-write randomly accessible memory cells (RAMs), more particularly to static RAMs which are based on the silicon-controlled rectifier (SCR) device, and especially to improvements in the speed with which new data can be written into such cells.

As is by now well known, the SCR-based memory cell uses an alternating-conductivity-type (PNPN) SCR structure to form each half or side of the memory cell. The alternating conductivity regions are typically formed by diffusion into an epitaxial layer, such that the resulting device is arrayed laterally along or across the layer.

The circuit has two stable operational states, corresponding to either the left or right side conducting while the other side is cut off. By arbitrary assignment of the logic bits 1 and 0 to these bistable states, the cell is used as a memory device for the storage of one data bit. Memory devices of a size large enough to be useful are formed of an addressable matrix-array which may include many thousands of such cells.

An important performance criterion of such devices is their speed of operation, which in turn affects the speed of operation of the computer using such memory cells. An important component of the overall speed of these memory devices has proven to be the speed with which they can be written to a new data state. Considered on the level of the memory cell itself, the writing speed amounts to the speed with which one side of the cell can be turned on while the other is turned off.

For reasons which will become apparent in the more detailed technical descriptions later in this application, the writing speed of such memory cells is principally limited by the substantial intrinsic capacitance associated with each cell. This intrinsic capacitance has considerable stored charge which causes delays whenever it is necessary to change the operational state of the cell to reflect the new data being written to it.

The magnitude of this capacitance could be significantly reduced by changes in the geometry and other parameters of the memory cell, but such changes would have other negative consequences. In particular, the large stored charge of the capacitance serves the positive purpose of increasing the immunity of the memory cell to alpha-particle-induced alterations of the memory state of the cell. Consequently, some method of increasing writing speed without significantly reducing capacitance is needed.

DESCRIPTION OF THE RELATED ART

One prior-art method is shown in U.S. Pat. No. 4,023,148, which issued May 10, 1977 to Heuber et al on a "Write Speed-up Circuit for Integrated Data Memories". The memory cell of this patent is diode-coupled to the bit-lines and uses PNP-transistor loading of its NPN transistors. The invention of this patent is a speed-up circuit (shown in the lower right portion of FIG. 3 of the patent) which is attached to each lower word-line of the matrix-array memory device. The speed-up circuit raises the potential of the lower word-line during a portion of the write cycle in order to reduce write current and write-time.

SUMMARY OF THE INVENTION

An object of the present invention is to increase the writing speed of SCR-based memory cells.

A second object of the present invention is to increase the writing speed of such cells while preserving good immunity to alpha-particle bombardment.

A third object of the present invention is to increase the writing speed of such cells without substantially degrading other performance criteria of the cell.

A fourth object of the present invention is to increase the writing speed of such cells without substantially increasing the complexity of the memory-cell circuit.

To the above ends, a memory cell according to the present invention is based on the SCR device, and each side of the cell uses a dual-emitter NPN transistor loaded by a PNP transistor. Each side of the cell includes a resistor in the path of current from the upper word-line into the PNP emitter. The resistance of the resistor is selected such that, upon the application of a selected read current, the voltage drop across the resistor is approximately equal to $(V_{HB} - V_{VB})/2$, where $V_{HB}$ is the voltage of the NPN-transistor base on the ON side of the cell, and $V_{LB}$ is the voltage of the NPN-transistor base on the OFF side of the cell.

When the cell is rewritten with new data, the OFF side is turned ON, which in turn cuts off the current flowing in the emitter resistor of the side which was ON. As a result, the emitter and base of the PNP transistor on the latter side abruptly rise in voltage, raising $V_{LB}$ and significantly shortening the time needed to write the cell.

The above and other features, objects and advantages of the present invention together with the best mode contemplated by the inventor thereof for carrying out his invention will become more apparent from reading the following detailed description of the invention, and from studying the associated drawing, the various figures of which represent:

DETAILED DESCRIPTION OF THE PRESENT INVENTION

Figure 1:
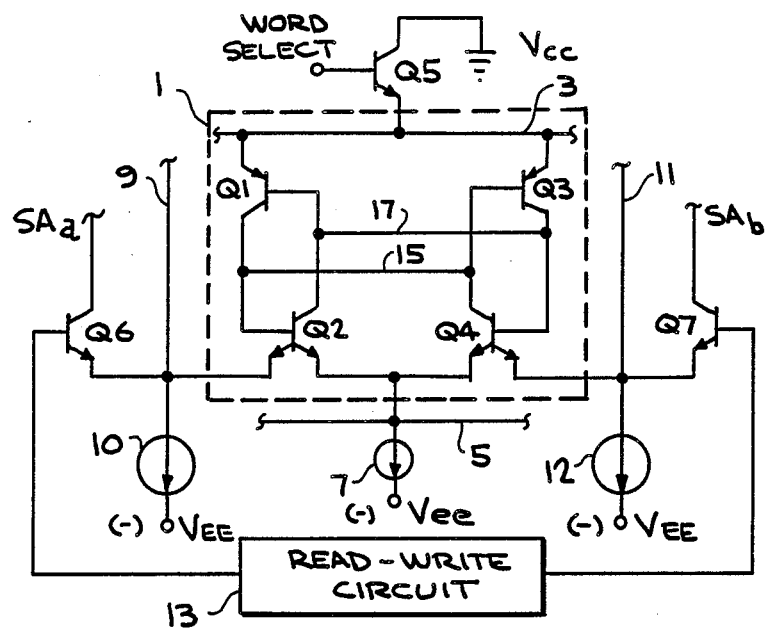
FIG. 1 is a schematic circuit diagram of an SCR-latched memory cell according to the prior art.

In FIG. 1, an SCR-latched static RAM memory cell of the prior art is illustrated. The core cell 1 of this memory cell is enclosed within a dotted line. Core cell 1 has on its left side a PNP transistor Q1 and a dual-emitter NPN transistor Q2, and on its right side, a PNP transistor Q3 and a dual-emitter NPN transistor Q4.

The base of Q1 connects to the collector of Q2, while the collector of Q1 connects to the base of Q2. Similarly, the collector of Q3 connects to the base of Q4, while the base of Q3 connects to the collector of Q4. Q1 and Q2 together with the above-mentioned connections are typically realized in practice as a single SCR device having alternating regions of opposite conductivity type (PNPN), laterally displaced from one another in an epitaxial semiconductor layer. The same is also true of Q3 and Q4.

An upper word-line 3 and a lower word-line 5 extend across an entire row of cells (not shown) which are like cell 1. Upper word-line 3 is driven from a source of the highest voltage $V_{CC}$, which may be 0 volts or ground for example, whenever a row-select decoder circuit (not shown) applies a high voltage to the base terminal of a word-driver transistor Q5.

A small standby current of, for example, 2 microamps is supplied to each of the similar memory cells on the same row as cell 1 by a single current source 7. Current source 7 is coupled between lower word-line 5 and a source of negative supply voltage $V_{EE}$, which might typically be −5 volts, for example.

A pair of sense-coupling transistors Q6 and Q7 are used to couple the two inputs $SA_a$ and $SA_b$ of a differential sense amplifier (not shown) to the emitters of Q2 and Q4, respectively, to sense the data bit held in cell 1 during a read operation.

Accordingly, inputs $SA_a$ and $SA_b$ are connected to the collectors of Q6 and Q7, respectively, while an emitter of Q2 is connected to the emitter of Q6, and an emitter of Q4 is connected to the emitter of Q7. A read-write circuit 13, illustrated in schematic-block diagram form, is connected to the bases of transistors Q6 and Q7 and supplies appropriate voltage levels to these bases for either a read or write operation.

A left bit-line 9 and a right bit-line 11 extend to all of the cells on the same column of the matrix-array as cell 1. A left bit-line current source 10, and a similar right bit-line current source 12, each coupled between one of the bit-lines and negative supply voltage $V_{EE}$, supply current to a cell when it is selected either for reading or writing. Relatively large currents of several hundred microamps are typically used for either reading or writing.

The connection of current source 10 in common to the emitters of both transistors Q6 and Q2 forms a differential pair arrangement in which the constant current produced by source 10 is divided between Q2 and Q6 in accordance with their relative base voltages. If the base voltages of Q2 and Q6 are identical, the current in each of these transistors will be approximately ½ of the current produced by source 10. However, if the base voltage of transistor Q2 is higher than the base voltage of transistor Q6, then a larger share of the constant current of source 10 will flow in Q2, and vice versa.

During a read operation, read-write circuit 13 applies the same sense-level voltage $V_{SL}$ to each of the bases of Q6 and Q7. The voltages on the bases of Q2 and Q4 differ in accordance with which one of them is conducting, which is equivalent to saying in accordance with whether the data bit stored in the cell is a 1 or a 0. Consequently, the currents produced in transistors Q6 and Q7 also differ in accordance with the stored data.

Since the current in each of transistors Q6 and Q7 is actually supplied from the sense amplifier connected to their collectors, the difference in current can be and is used to indicate or sense the data. In practice, $V_{SL}$ is selected such that it lies midway between the base voltages of Q2 and Q4, with the result that one of Q6 and Q7 has substantially no current while the other has substantially the full current supplied by source 10 or 12.

For the purpose of examining a write operation in the prior art memory cell of FIG. 1, let it be assumed that the left side of the circuit (transistors Q1 and Q2) is ON or conducting while the right side is OFF or non-conducting. The write operation will reverse this state, and make the right side of the cell ON and the left OFF.

The bistable behavior of cell 1 is caused by cross-coupling the two sides of the circuit by a left-base line 15 and a right-base line 17. Left-base line 15 connects the base electrode of NPN transistor Q2 to the collector of NPN transistor Q4, while right-base line 17 connects the base of Q4 to the collector of Q2.

Since, as stated above, Q1 and Q2 are assumed to be ON prior to the write operation, right-base line 17 will be at a low voltage while left-base line 15 will be at a high voltage. Accordingly, if the cell is selected and $V_{SL}$ is applied to Q6 and Q7 bases, substantially all of the current produced by source 10 flows in transistor Q2, and transistor Q6 is substantially cut off. Conversely, on the right side of the cell, substantially all of the current of source 12 flows in transistor Q7.

In order to rewrite the cell, read-write circuit 13 alters the voltages on the bases of Q6 and Q7 in a sense to cut off the current in Q7, inducing current to flow in Q4, and to turn on transistor Q6, thus steering current from transistor Q2. To do this, a voltage lower than the voltage on the base of Q4 is applied to the base of Q7, and a voltage higher than the voltage on the base of Q2 is applied to the base of Q6.

The turning-ON of Q4 creates a low impedance path through its collector terminal, and left-base line 15 is rapidly discharged by the substantial write current produced by source 12, despite the considerable capacitance of this circuit node. The corresponding drop in the potential of line 15 in turn lowers the potential on the base of Q2, which accordingly starts to turn off.

Simultaneously, Q3 starts to turn ON in response to the drop in potential on its base, which is also connected to line 15. The resulting drop in impedance between its emitter and collector permits current to flow from upper word-line 3 to charge up line 17. When line 17 has charged sufficiently to increase the voltage on the base of PNP transistor Q1, that transistor starts to turn OFF, completing the write cycle.

Unfortunately, while the drop in potential of line 15 is satisfactorily rapid, the rise in potential on line 17 is much slower in this prior-art cell because of the large amount of stored charge and consequent delay in turning on PNP transistor Q3. In fact, the writing speed of the cell of FIG. 1 is limited by this factor as will become clearer from a consideration of FIG. 2.

Figure 2:
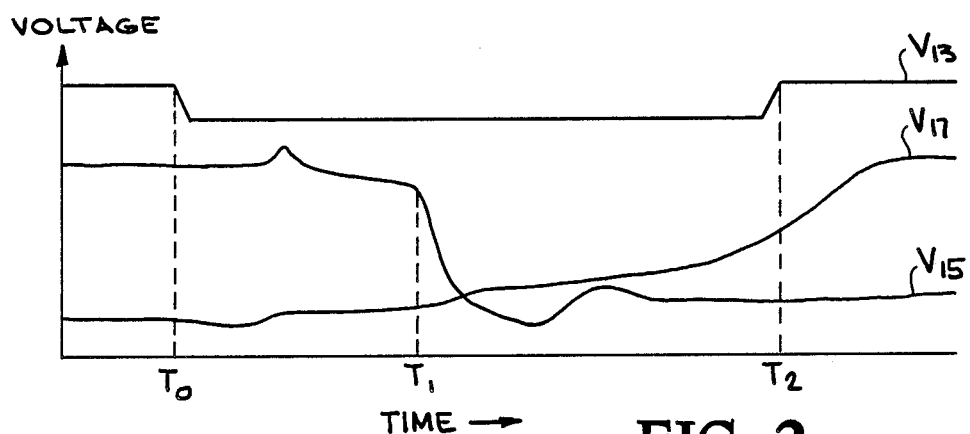
FIG. 2 is a plot of voltage versus time illustrating the performance of the prior-art circuit of FIG. 1 during a write cycle.

The write-enable voltage supplied by read-write circuit 13 is plotted versus time and is labeled $V_{13}$ in FIG. 2. Similarly, the voltages on lines 15 and 17 are labeled $V_{15}$ and $V_{17}$. Trace $V_{13}$ shows the write cycle beginning at time $T_0$ when a low voltage is applied to the base of Q7 and a high voltage to the base of Q6. The write cycle continues until time $T_2$, when write-enable voltage can be safely removed and the cell can be considered securely written to the new data state.

The time required to complete this write is undesirably long because of the slow rate of divergence between traces $V_{15}$ and $V_{17}$. However, until these two voltage levels have achieved a good separation, the write operation might fail from either of two separate causes if read-write circuit 13 were to remove the write-enable voltages from the bases of Q6 and Q7.

The first of these causes results from the fact that while $V_{17}$ is only slightly above $V_{15}$ and the cell is in transition from one data state to the other, any noise voltages which might be present on supply lines or induced from the operating environment could cause the $V_{15}$ and $V_{17}$ to recross one another and permit the cell to revert to its former data state. Only when the separation between the traces has become large enough to exceed any noise voltage which might appear can this write failure mode be ruled out.

A second cause of failure results from the fact that the sense amplifier must sense a substantial difference in the currents on its two inputs $SA_a$ and $SA_b$ in order to be able to unambiguously read the data in the cell. In practice this requires that the current in one of transistors Q6 and Q7 must be cut off while the other conducts the full current of its associated current source 10 or 12.

During the time when traces $V_{15}$ and $V_{17}$ are close together there will in general be current in both Q6 and Q7. If the write operation were terminated during this time period, the cell then would be in a read status. An attempt to read the data in the cell during this period could result in a "write-recovery glitch" in which indeterminate data is read, notwithstanding the fact that the cell remains stable in the new data state to which it was written.

Disregarding the minor variations in the trace of $V_{15}$, this voltage trace shows a satisfactorily rapid drop in voltage, dominated by a sharp decline beginning at time $T_1$. However, the rise in voltage on line 17 as illustrated by trace $V_{17}$ is relatively slow, and lacks any region of sharp rise like the decline in $V_{15}$. Consequently, traces $V_{15}$ and $V_{17}$ remain too close together to permit removal of the write-enable voltage $V_{13}$ for some time after $T_1$.

Figure 3:
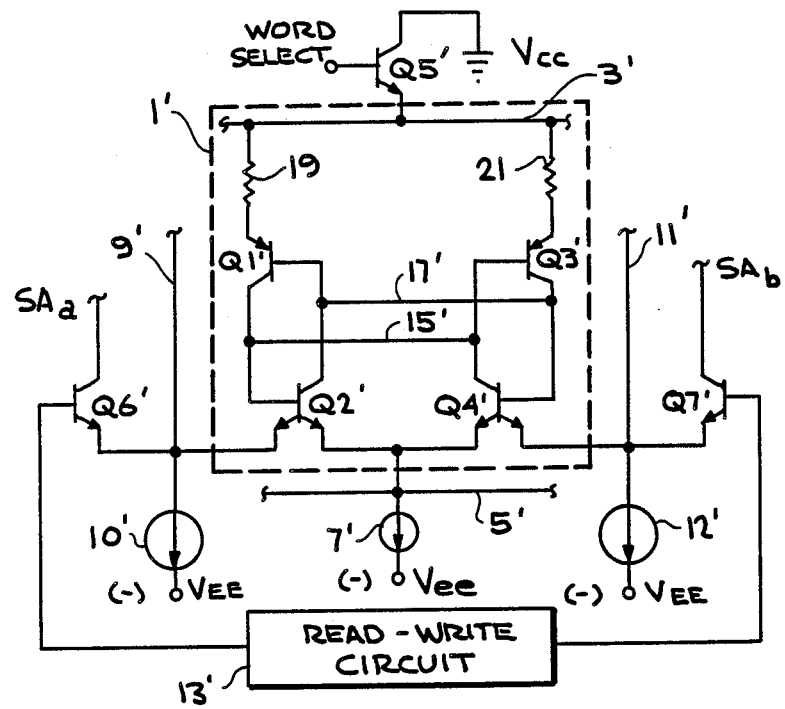
FIG. 3 is a schematic circuit diagram of an SCR-latched memory cell according to the present invention.

In FIG. 3, a static RAM memory cell according to the present invention is illustrated, using primed reference numerals to indicate parts that correspond to the parts of FIG. 1. The core cell 1' of the memory cell of FIG. 3 has the same configuration as the core cell 1 of FIG. 1 with the exception that, in accordance with the present invention, the left side of the cell has been provided with an emitter resistor 19 coupled between the emitter of Q1' and the upper word line 3', and the right side of the cell has a similar emitter resistor 21 coupled between the emitter of Q3' and upper word line 3'.

Since the operation of the circuit of FIG. 3 is identical to that of FIG. 1 with the exception of the effects caused by resistors 19 and 21, the detailed description of the interconnections of the various parts will not be repeated. Instead, the modifications introduced by the presence of resistors 19 and 21 will be described.

Assuming, as in FIG. 1, that the left side (transistors Q1' and Q2') of cell 1' is ON, then the right side (transistors Q3' and Q4') is OFF. Under these conditions resistor 21 has no effect since no current flows in the right side. However resistor 19 is conducting all of the current which flows in the left side of the cell and will cause a drop in voltage of $I_{19}R_{19}$, where $I_{19}$ and $R_{19}$ are the current in, and the resistance of, resistor 19. This drop will in turn cause a lowering of voltage on both of lines 15' and 17'.

A write operation such as was described above with respect to FIG. 1 proceeds in much the same manner, beginning with the turning ON of transistor Q4' when read-write circuit 13' cuts off the current in transistor Q7'. As before, this causes a rapid drop in the high voltage on left-base line 15', which starts to turn ON transistor Q3' and turn OFF transistor Q1'.

However, at this point the operation of the circuit of FIG. 3 diverges from that of FIG. 1. In accordance with the present invention, the decline in current on the left (ON) side of cell 1' causes a corresponding decline in the $I_{19}R_{19}$ drop across resistor 19. Accordingly, the voltage on the emitter of Q1', which had been down from the voltage on upper word line 3' by this same $I_{19}R_{19}$ drop, immediately rises.

Since the base of Q1', connected to line 17', follows the voltage on the emitter of Q1', line 17 is also raised in voltage as current in resistor 19 subsides. By choosing appropriate values for resistors 19 and 21 and current source 10', this jump in voltage can be made large enough to significantly shorten the time required to write new data into cell 1', as will become apparent from considering FIG. 4.

Figure 4:
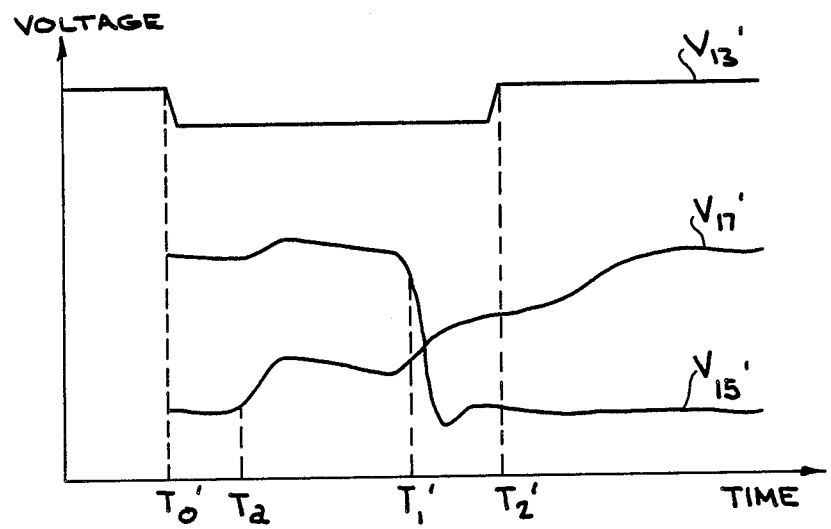
FIG. 4 is a plot of voltage versus time, illustrating the improved performance of the present invention during a write cycle.

In FIG. 4 are plotted the same voltages as in FIG. 2 such that the improvement in writing speed is clearly visible. Time $T_{1'}$, the time when voltage $V_{15'}$ begins its steep descent, is approximately the same as it was in FIG. 2. However, the drop in $V_{15'}$ is noticeably steeper, since the cell transits more abruptly and completely to the new data without the long period of uncertainty immediately following time $T_1$ in FIG. 2.

The plot of voltage $V_{17'}$ actually has a final slope (after time $T_{2'}$, for example) which is little different from the corresponding slope of $V_{17}$ in FIG. 2, but the trace is given a considerable lift by two voltage jumps. The first of these jumps, occurring at time $T_a$, is caused when some of the current which had been flowing in the left or ON side of the cell is steered to transistor Q6'. This steering effect is largely due to the relatively high driving voltage imposed on the base of Q6' by read-write circuit 13'. The resultant loss in current through resistor 19 causes the rise in $V_{17'}$ voltage.

The second jump, at approximately time $T_{1'}$, results because Q3' on the right side of the cell, which had been OFF, is now turning ON, such that current is further steered away from resistor 19, causing a further rise in $V_{17'}$ voltage. It is believed that the greater part of this current may have been flowing, prior to the turning-ON of Q3', in a path from the collector of Q1', through line 15', and from the collector to the emitter of Q4', finally entering source 12'.

The result of these two rises is that the $V_{17'}$ voltage is brought to a level comfortably above that of $V_{15'}$ very quickly after time $T_{1'}$. In fact, tests on sample devices using the teachings of this application have shown that writing can be considered complete within as little as 0.5 nanoseconds after time $T_{1'}$ in FIG. 4. Memory cells without the improvements of this application can take from 5 to 8 nanoseconds after time $T_1$ in FIG. 2 to be securely written.

The size of resistors 19 and 21 may be selected empirically in view of the size of the write currents produced by bit-line current sources 10' and 12'. In making this selection, the increase in the voltage of base line 17' needed to permit the write operation to be considered complete becomes significant, and this in turn involves questions of what voltage must be developed on base line 15' to cause the sense amplifier to correctly read the new data.

In practice, the voltage difference between base line 15' and 17' is approximately 0.7 volt, or very nearly the same as the $V_{BC}$ voltage of NPN transistors Q2' and Q4' when saturated. The sense-level voltage at the bases of Q6' and Q7' is established at a level between the voltages of lines 15' and 17' and often at the midpoint of these voltages. Accordingly, each of lines 15' and 17' is approximately only 0.3 to 0.4 volt away from the sense level.

In order to sense the data present in the cell during a read operation, the voltage of the ON-side base line must exceed the sense-level voltage established at the bases of Q6' and Q7'. Thus, reliable reading of the cell cannot commence until after base line 17' has risen by approximately 0.35 volts (or ½ the base-emitter voltage of transistors Q2' or Q4'), such that its voltage matches the sense level. Consequently, resistors 19 and 21 may desirably be selected such that they produce approximately this voltage when ON-side current is present in them.

Figure 5:
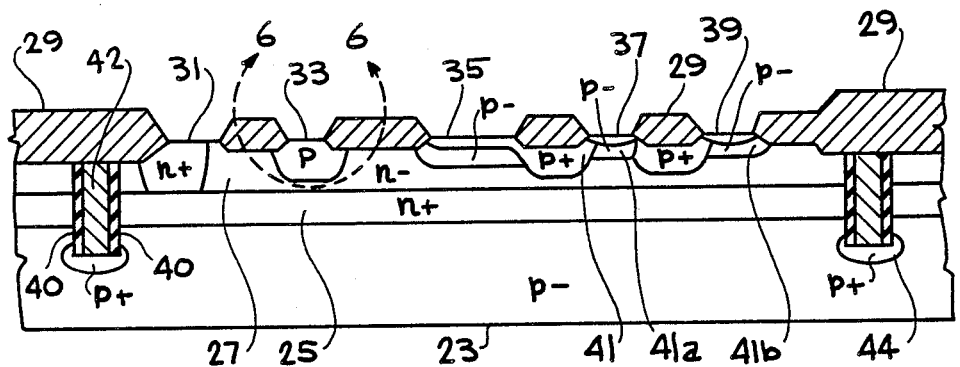
FIG. 5 is a cross-sectional representation of a physical realization of the circuit of FIG. 3 according to the present invention.

Turning now to FIG. 5, a greatly enlarged view of the structure of a device according to the present invention is shown. FIG. 5 is a physical implementation of one side of the memory-cell circuit of FIG. 3. For example, FIG. 5 implements the transistors Q1' and Q2', or Q3' and Q4', together with their interconnections as shown in FIG. 3.

In the description that follows, it will be understood that n+ and p+ regions of the structure are relatively highly conductive n-type and p-type silicon, respectively, n and p regions are intermediately conductive n-type and p-type silicon, respectively, and n− and p− regions are n-type and p-type silicon of relatively low conductivity, respectively. Such regions can in general be produced by diffusion or ion implantation using techniques which are well known.

The basic structure of the device of FIG. 5 consists of a p-substrate 23 of silicon, over which has been formed an n+ burial layer 25, an n− epitaxial layer 27, and a windowed oxide layer 29. Layer 29, shown with cross-sectional lines, is made of $SiO_2$ and serves to insulate the various active regions of the semiconductor device while permitting contact with the various portions through its windows.

An n+ region 31, commonly called a "collector sinker" or "collector pickup", is formed by ion implantation or by diffusion using well-known techniques. Region 31 serves as a highly conductive path between a collector contact (not shown) formed on its surface and the n+ burial layer 25 below. Layer 25 extends under all portions of the weakly conductive n− epitaxial layer 27 and thus interconnects them and region 31. Region 31, burial layer 25, and n− epitaxial layer 27 all are part of the collector electrode of NPN transistor Q2'.

A p region 33 is formed next to region 31 and may serve both as the emitter of PNP transistor Q1' and, as will be discussed in more detail below, as a realization of an emitter resistor such as resistor 19 in FIG. 3.

The base of NPN transistor Q2' is formed as a relatively complex layer 41 of alternating p+ and p− regions. Of these regions, 41a and 41b are the active bases and are formed of p− silicon. The external base region 35 is formed of p+ silicon and serves as a low-resistance region to which a base contact (not shown) can be joined. A pair of n+ regions 37 and 39 form the dual emitters of the dual-emitter NPN transistor Q2'. The n+ regions 37 and 39 and p+ region 35 extend for only a shallow depth into layer 41.

A pair of insulative polysilicon barriers 42 extend downwardly in trenches from insulative layer 29 to terminate in p+ trench-isolation regions 44 in p− substrate 23. The faces of the various semiconductive layers which are interrupted by barriers 42 are passivated by thin, thermally grown oxide layers 40.

The structure of FIG. 5 is a merged structure, since regions 31, 25, and 27 form not only the collector of NPN transistor Q2' but also the base of PNP transistor Q1'. Similarly, region 35 and layer 41 serve not only as the base of NPN transistor Q2' but also as the collector of PNP transistor Q1'.

As thus far described, the structure of FIG. 5 is entirely conventional and amounts to a realization of the circuit of FIG. 1 as well as FIG. 3. However, in accordance with the present invention, the structure of FIG. 5 can be made realize the emitter resistors 19 or 21 by the manner in which p region 33, the emitter of a PNP transistor such as Q1', is formed.

Figure 6:
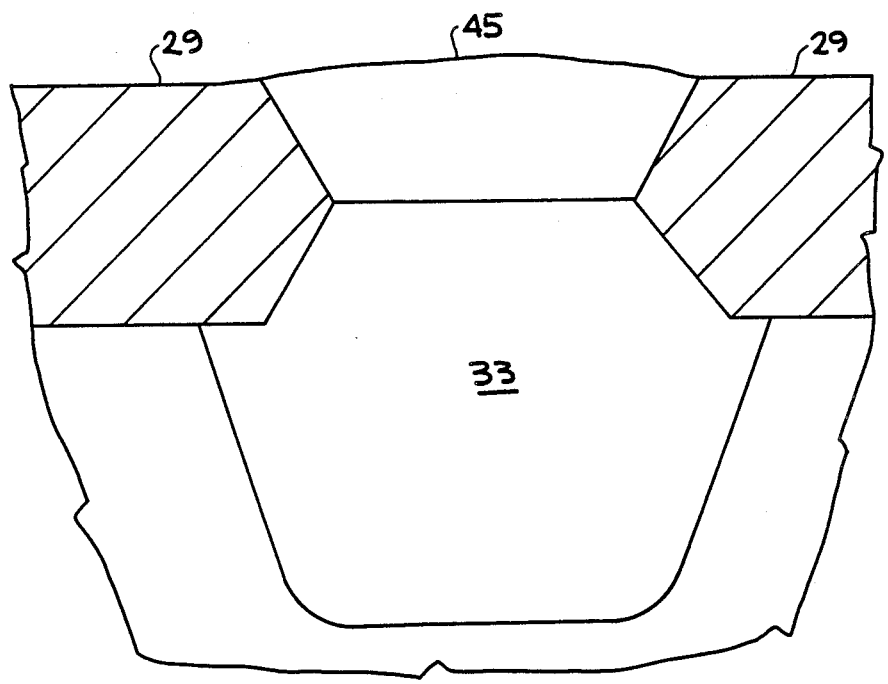
FIG. 6 is a greatly enlarged cross-sectional view of the portion of FIG. 5 within the arrows 6—6, illustrating an alternative embodiment of the invention.

In particular, region 33 can be made to incorporate an emitter resistor such as resistor 19 either by being formed in a way that causes it to have a relatively high intrinsic resistance, or by having a thin-film resistor deposited over it as shown in FIG. 6.

In FIG. 6, region 33 has been shown in greatly enlarged form to illustrate that, in accordance with the present invention, a thin-film resistive region 45 may be provided overlaying the surface of region 33. Region 45 may in practice be formed by the well-known thin-film techniques used to form resistors in linear integrated circuits.

Such techniques can readily realize a selected resistance having one end in contact with region 33 as shown and extending laterally (for example, into the plane of the drawing) therefrom to join with an emitter contact (not shown). In this way, resistive region 45 forms a resistor of a selected size in series with p region 33 as resistor 19 is in series with the emitter of Q1' in FIG. 3.

Alternatively, it is possible to cause region 33 to have sufficient intrinsic resistance to realize resistor 19 by using light-dose, deepimplantation techniques in forming region 33. For example, if the region is formed by ion implantation at an ion dose of 1 to $3 \times 10^{14}$ per $cm^2$ and at an energy of 160–200 keV, it is possible to produce sufficient intrinsic resistance to realize practical values of resistor 19.

Although this invention has been described with some particularity in reference to specific embodiments thereof which, taken together, comprise the best mode contemplated by the inventor for carrying out his invention, many changes could be made and many alternative embodiments could thus be derived without departing from the scope of the invention. Consequently, the scope of the invention is to be determined only from the following claims.

I claim:

1. A bistable memory cell for connection to a source of electric potential, comprising:
   a first and a second NPN transistor, each of said NPN transistors having a collector terminal for coupling to said source of electric potential, a first emitter terminal, and a base terminal;
   each of said NPN transistors having an ON state in which it presents a low impedance to current from said source and an OFF state in which it presents a high impedance to current from said source;
   each of said NPN transistors being responsive to the voltage at its base terminal relative to its first emitter terminal by being ON when said voltage exceeds a certain threshold voltage, and by being OFF when said voltage is less than said threshold voltage;

cross-coupling means coupling the collector terminal of each of said NPN transistors to the base terminal of the other of said NPN transistors to so constrain the operation of said NPN transistors as to cause either one of them to be ON and the other to be OFF;

a first PNP transistor having its emitter terminal coupled to said source of electric potential, its collector terminal coupled to said first NPN transistor base terminal, and its base terminal coupled to said first NPN transistor collector terminal;

a second PNP transistor having its emitter terminal coupled to said source of electric potential, its collector terminal coupled to said second NPN transistor base terminal, and its base terminal coupled to said second NPN transistor collector terminal;

write-accelerator means, coupled to said NPN and PNP transistors, to cause the voltage at the base terminal of the one of said NPN transistors which is OFF to shift in a sense to approach said threshold voltage in response to a decline in current in the one of said NPN transistors which is ON;

said write-accelerator means comprising a first resistor coupled in series between said first PNP transistor emitter terminal and said source of electric potential, and a second resistor coupled in series between said second PNP transistor emitter terminal and said source of electric potential; and each of said first and second resistors having a resistance selected to cause base-terminal voltage to shift by an amount which is substantially nearly ½ said threshold voltage in response to the turning OFF of current in said ON NPN transistor;

each of said NPN transistors having a second emitter terminal; and a standby current source coupled between said second emitter terminals and said source of electric potential to induce and regulate a constant standby current in the one of said active switching devices which is ON.

* * * * *